(12) United States Patent
Vittu et al.

(10) Patent No.: US 9,134,421 B2
(45) Date of Patent: Sep. 15, 2015

(54) SUBSTRATE WAFER WITH OPTICAL ELECTRONIC PACKAGE

(75) Inventors: Julien Vittu, Villard de Lans (FR); Romain Coffy, Saint Martin le Vinoux (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 501 days.

(21) Appl. No.: 13/531,638

(22) Filed: Jun. 25, 2012

(65) Prior Publication Data
US 2013/0009173 A1 Jan. 10, 2013

(30) Foreign Application Priority Data
Jul. 8, 2011 (FR) ..................................... 11 56225

(51) Int. Cl.
| | | |
|---|---|---|
| H01L 33/00 | (2010.01) | |
| G01S 17/02 | (2006.01) | |
| G01S 7/481 | (2006.01) | |
| G01J 1/02 | (2006.01) | |
| G01J 1/04 | (2006.01) | |
| H01L 31/16 | (2006.01) | |
| H01L 33/48 | (2010.01) | |
| H01L 25/16 | (2006.01) | |

(52) U.S. Cl.
CPC .............. *G01S 17/026* (2013.01); *G01J 1/0271* (2013.01); *G01J 1/0403* (2013.01); *G01J 1/0407* (2013.01); *G01S 7/4813* (2013.01); *H01L 31/16* (2013.01); *H01L 25/167* (2013.01); *H01L 33/48* (2013.01); *H01L 2224/48227* (2013.01)

(58) Field of Classification Search
CPC .................................................... H01L 25/167
See application file for complete search history.

(56) References Cited

U.S. PATENT DOCUMENTS

| | | |
|---|---|---|
| 5,130,531 A | 7/1992 | Ito et al. |
| 5,226,052 A | 7/1993 | Tanaka et al. |
| 6,787,869 B1 | 9/2004 | Vittu |
| 7,539,366 B1 | 5/2009 | Baks et al. |

(Continued)

FOREIGN PATENT DOCUMENTS

| | | |
|---|---|---|
| DE | 19616969 A1 | 10/1997 |
| EP | 0992824 A2 | 4/2000 |

OTHER PUBLICATIONS

INPI Search Report and Written Opinion for FR1156225 mailed Jan. 27, 2012 (10 pages).

*Primary Examiner* — Kimberly Rizkallah
*Assistant Examiner* — Alexander Belousov
(74) *Attorney, Agent, or Firm* — Gardere Wynne Sewell LLP

(57) ABSTRACT

An electronic package includes a substrate wafer having front and rear faces and a through passage having a front window and a blind cavity communicating laterally with the front window. A receiving integrated circuit chip is mounted on the rear face and includes an optical sensor situated opposite the blind cavity. A transparent encapsulant extends above the optical sensor and at least partially fills the through passage. An emitting integrated circuit chip, embedded in the transparent encapsulant, includes an optical emitter of luminous radiation. The emitting integrated circuit chip may be mounted to the front face or within the through passage to the receiving integrated circuit chip. The substrate wafer may further include a second through passage. The receiving integrated circuit chip further includes a second optical sensor situated opposite the second through passage. A cover plate is mounted to the front face at the second through passage.

18 Claims, 6 Drawing Sheets

(56) References Cited

U.S. PATENT DOCUMENTS

| | | | |
|---|---|---|---|
| 2005/0139946 A1* | 6/2005 | Hung et al. | 257/433 |
| 2005/0254758 A1 | 11/2005 | Kropp | |
| 2008/0085038 A1* | 4/2008 | Huang et al. | 382/124 |
| 2009/0028497 A1 | 1/2009 | Kodama et al. | |
| 2009/0045498 A1* | 2/2009 | Braden et al. | 257/687 |
| 2009/0051804 A1* | 2/2009 | Nomura et al. | 348/344 |
| 2009/0159788 A1* | 6/2009 | Tang et al. | 250/239 |
| 2009/0174048 A1* | 7/2009 | Liu et al. | 257/676 |
| 2010/0246902 A1* | 9/2010 | Rowe et al. | 382/115 |
| 2010/0259766 A1* | 10/2010 | Wiese et al. | 356/614 |
| 2011/0024627 A1 | 2/2011 | Yao | |
| 2011/0057102 A1 | 3/2011 | Yao | |
| 2011/0057108 A1 | 3/2011 | Yao et al. | |
| 2011/0057129 A1 | 3/2011 | Yao et al. | |
| 2011/0057130 A1* | 3/2011 | Hsu et al. | 250/552 |

\* cited by examiner

SUBSTRATE WAFER WITH OPTICAL ELECTRONIC PACKAGE

PRIORITY CLAIM

This application claims priority from French Application for Patent No. 1156225 filed Jul. 8, 2011, the disclosure of which is hereby incorporated by reference.

TECHNICAL FIELD

The present invention relates to the field of electronic packages comprising, for example, optical electronic devices.

BACKGROUND

An electronic package is known which comprises a mounting plate, a first integrated circuit chip provided with a first optical detector, a second integrated circuit chip provided with a second optical detector, and a third integrated circuit chip provided with an optical emitter, these three chips being bonded onto the mounting plate. An opaque cover is bonded onto the periphery of the mounting plate and optically insulates each of the chips by virtue of the existence of three separate chambers. The cover has three separate openings, formed facing the three abovementioned optical elements and provided with three transparent protection plates.

This known electronic package requires the use of a mounting plate and the fabrication of a specially dimensioned cover, involves numerous mounting steps and external electrical connection difficulties regarding the integrated circuit chips and has large dimensions compared to the size of the integrated circuit chips.

SUMMARY

The aim of the present disclosure is to propose an electronic package which is generally simpler and consequently less costly.

There is proposed an electronic package which comprises: a substrate wafer exhibiting a front face and a rear face and exhibiting a through passage comprising a front window and a forwardly blind cavity communicating laterally with said window; and a receiving integrated circuit chip exhibiting a front face mounted on the rear face of the substrate wafer and comprising, in this front face, at least one optical sensor of luminous radiation situated in front of said cavity and offset laterally relative to said window.

The electronic package furthermore comprises: a transparent encapsulation means extending above said optical sensor and at least partially filling said through passage; and an emitting integrated circuit chip embedded in said transparent encapsulation means and comprising, in a front face, an optical emitter of luminous radiation.

The emitting integrated circuit chip may be mounted on the front face of the substrate wafer, in proximity to said through passage.

The emitting integrated circuit chip may be installed in said through passage and mounted on the front face of the receiving integrated circuit chip, on a zone situated facing said window.

A leaktight ring may be provided between the substrate wafer and the receiving integrated circuit chip, around said through passage.

There is proposed an electronic package which comprises: a substrate wafer exhibiting a front face and a rear face and exhibiting a main through passage and a secondary through passage, this secondary through passage comprising a front window and a forwardly blind cavity communicating laterally with said window; and a receiving integrated circuit chip exhibiting a front face mounted on the rear face of the substrate wafer and comprising, in this front face, a main optical sensor of luminous radiation situated opposite said main through passage and an optical sensor of luminous radiation situated in front of said cavity and offset laterally relative to said window.

The electronic package furthermore comprises: a transparent encapsulation means extending above said secondary optical sensor and at least partially filling said secondary through passage; and an emitting integrated circuit chip embedded in said transparent encapsulation means and comprising, in a front face, an optical emitter of luminous radiation.

The emitting integrated circuit chip may be mounted on the front face of the substrate wafer, in proximity to said secondary through passage.

The emitting integrated circuit chip may be installed in said secondary through passage and mounted on the front face of the receiving integrated circuit chip, on a zone situated opposite said window.

Leaktight rings may be provided between the substrate wafer and the receiving integrated circuit chip, around said through passages.

A transparent plate may be provided above said main sensor.

Electrical connection elements may be provided between the substrate wafer and the receiving integrated circuit chip.

An encapsulation material may be provided between the substrate wafer and the receiving integrated circuit chip.

The substrate wafer may comprise an electrical connection network linked to said integrated circuit chips and is provided with external electrical connection elements.

Also proposed is a portable or mobile telephone comprising, internally, an electronic package in which the shell of the telephone has at least one opening situated at least facing at least one of said through passages.

BRIEF DESCRIPTION OF THE DRAWINGS

Electronic packages according to the present invention will now be described by way of nonlimiting examples, illustrated by the appended drawing in which.

DETAILED DESCRIPTION OF THE DRAWINGS

Figure 1:
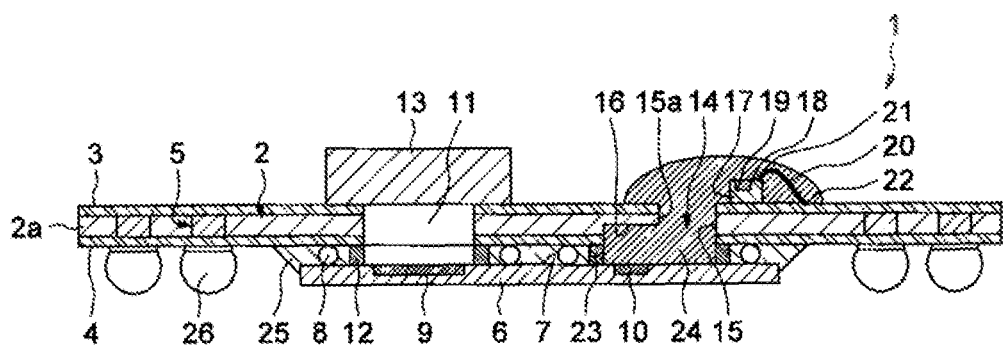
FIG. 1 represents a longitudinal cross section of an electronic package.
Figure 2:
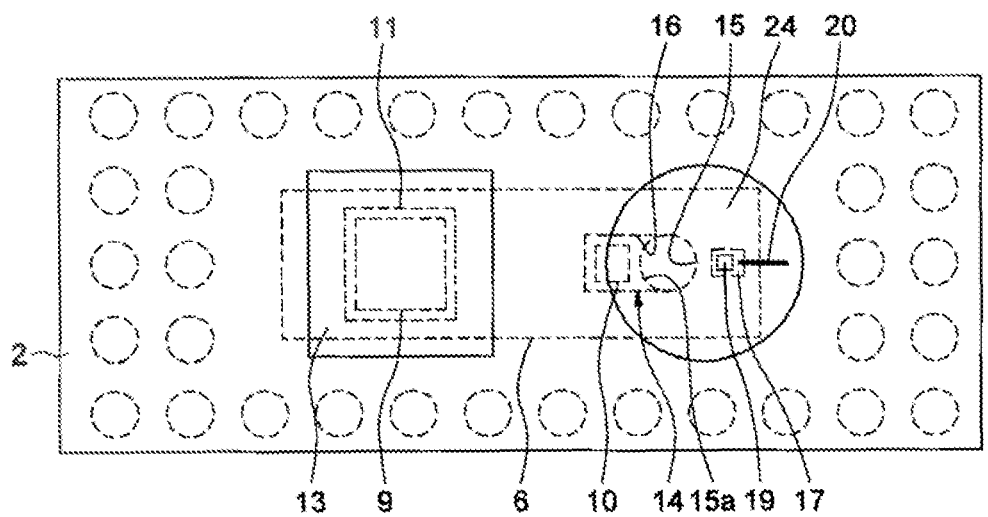
FIG. 2 represents a plan view of the electronic package of FIG. 1.

As illustrated in FIGS. 1 and 2, an electronic package 1 comprises an opaque substrate wafer 2 which has opposing front and rear faces 3 and 4 and which comprises an electrically insulating material 2a and an integrated electrical connection network 5 for making the electrical connections from one face to the other and on the faces 3 and 4.

The electronic package 1 comprises a receiving integrated circuit chip 6, a front face 7 of which is some distance from the rear face 4 of the substrate wafer 2 and is mounted on this rear face 4 by way of a plurality of electrical connection elements 8 which ensure electrical connection between front pads of the receiving integrated circuit chip 6 and rear pads of the electrical connection network 5.

The receiving integrated circuit chip 6 comprises, in its front face 7 and on areas spaced apart, a main integrated light radiation optical sensor 9 and a secondary integrated light radiation optical sensor 10, spaced apart from one another.

According to a particular exemplary embodiment, the substrate wafer 2 is rectangular and the integrated circuit chip 6 is rectangular and extends longitudinally along the longitudinal axis of the substrate wafer 2, the optical sensors 9 and 10 being placed along the longitudinal axis of the substrate wafer 2.

Above and opposite the main optical sensor 9, the substrate wafer 2 exhibits a main through passage 11, passing through it directly from the rear to the front, which is larger than the zone of this main optical sensor 9 and which overhangs all its sides.

In the space separating the rear face of the substrate wafer 2 and the front face of the receiving integrated circuit chip 6 and around the main through passage 11, is made, optionally, a leaktight ring 12.

On the front face of the substrate wafer 2 is fixed, for example by gluing, a transparent plate 13, for example made of glass, which covers the main through passage 11 and is slightly larger than the latter.

Above the optical sensor 10, the substrate wafer 2 exhibits a secondary through passage 14 which comprises a part 15 which passes directly through the substrate wafer from the rear to the front, open towards the front and which is offset laterally with respect to the secondary optical sensor 10 and a part 16 in the form of a cavity, open towards the rear, blind towards the front, formed above and opposite the secondary optical sensor 10 and communicating laterally with the part 15, so that the secondary through passage 14 forms a front window 15a open towards the front and offset laterally with respect to the secondary optical sensor 10.

The electronic package 1 also comprises an emitting integrated circuit chip 17 the rear face of which is mounted, for example by gluing, on the front face 3 of the substrate wafer 2, in proximity to the edge of the window 15a of the secondary through passage 14, and which comprises, in its front face 18, an optical integrated emitter 19. The emitting integrated circuit chip 17 is linked to the electrical connection network 5 by means which comprise at least one electrical connection wire 20 which links a pad 21 of the front face of the emitting integrated circuit chip 17 and a pad 22 of the front face 3 of the substrate wafer 2.

In the space separating the rear face of the substrate wafer 2 and the front face of the receiving integrated circuit chip 6 and around the secondary through passage 14, is made, optionally, a leaktight ring 23.

The electronic package 1 furthermore comprises a transparent encapsulation block 24 which fills the secondary through passage 14 and extends up to the front face 7 of the receiving integrated circuit chip 6, inside the leaktight ring 23, and which overhangs towards the front, projecting over the front face 3 of the substrate plate 2, while embedding the emitting integrated circuit chip 17 and the electrical connection wire 20.

The space separating the rear face of the substrate wafer 2 and the front face of the receiving integrated circuit chip 6 and around the leaktight rings 12 and 23, is filled with an encapsulation and reinforcing material 25 up to the leaktight rings 12 and 23. The leaktight rings 12 and 23 and/or the material 25 are opaque.

To electrically link the electronic package 1 to another component such as a printed circuit board (not represented), the rear face 4 of the substrate wafer 2 may be provided with metallic electrical connection elements 26, such as balls, placed on rear bump contacts of the electrical connection network 5.

The electronic package 1 operates as follows.

The light radiation emitted by the optical emitter 19 of the emitting integrated circuit chip 17 is emitted into the material of the transparent encapsulation block 24, is diffused in this block 24 and is diffused towards the outside through the front face of the transparent encapsulation block 24. The light radiation, which is diffused in the material of the transparent encapsulation block 24, also reaches the secondary optical sensor 10 of the receiving integrated circuit chip 6.

Moreover, the main optical sensor 9 of the receiving integrated circuit chip 6 receives the outside light radiation through the transparent plate 13.

Thus, the secondary optical sensor 10 of the receiving integrated circuit chip 6 receives light radiation mostly from the optical emitter 19 and secondarily from the outside through the offset front window 15a, the signal from the secondary optical sensor 10 being able to form a reference for the analysis of the signal from the main optical sensor 9 of the receiving integrated circuit chip 6.

The result of the above is that the electronic package 1 can be used as a proximity sensor.

The electronic package 1 can be obtained from collective fabrication that will now be described.

Figure 3:
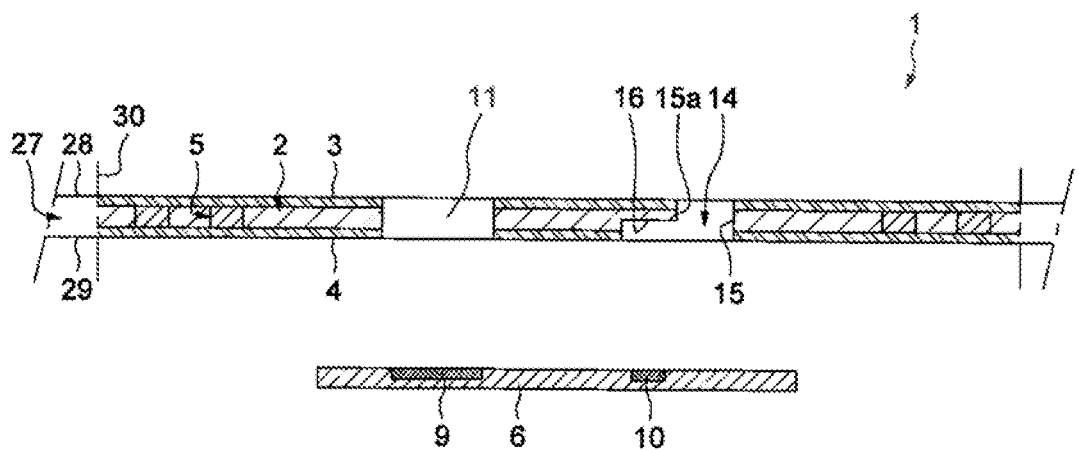
FIGS. 3 to 10 represent fabrication steps of the electronic package of FIG. 1.
Figure 4:
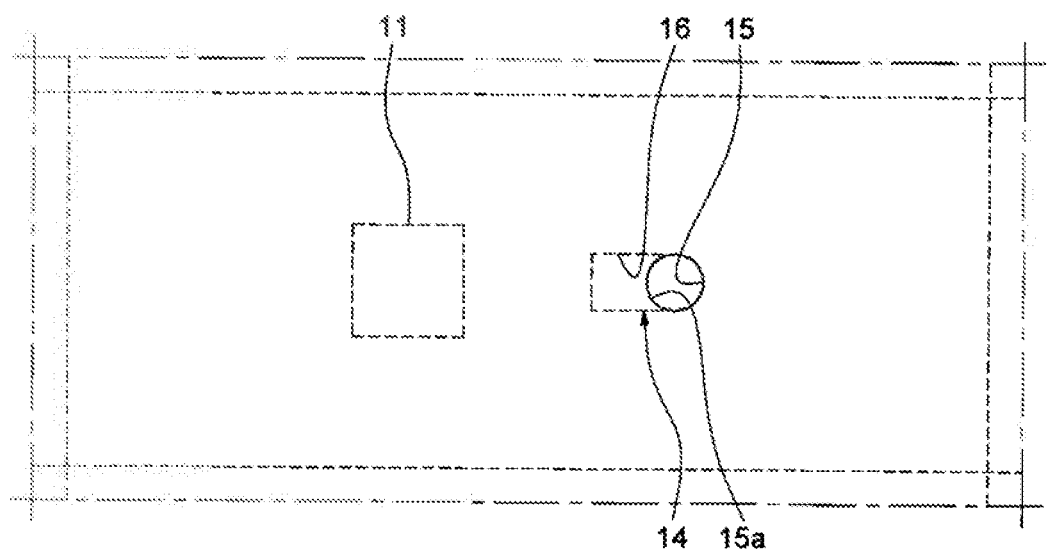

As illustrated in FIGS. 3 and 4, there is a collective substrate wafer 27 having front and rear faces 28 and 29, and having a plurality of adjacent placements 30 established according to a matrix and corresponding to a plurality of electronic packages 1 to be produced. In each placement 30, the collective substrate wafer 33 comprises an electrical connection network 5. There is also a plurality of receiving integrated circuit chips 6, to be mounted on the collective substrate plate 27, on the placements 30.

In each placement is made a main through passage 11 and a secondary through passage 14, at locations such that the optical sensors 9 and 10 of a receiving integrated circuit chip 6 can be disposed as described previously. The main through passage 11 may be produced by a simple drilling operation. To produce the secondary through passage 14, a simple drilling operation is firstly carried out to obtain the part 15, then a facing operation is carried out via the rear face 4 to obtain the cavity 16.

Figure 5:
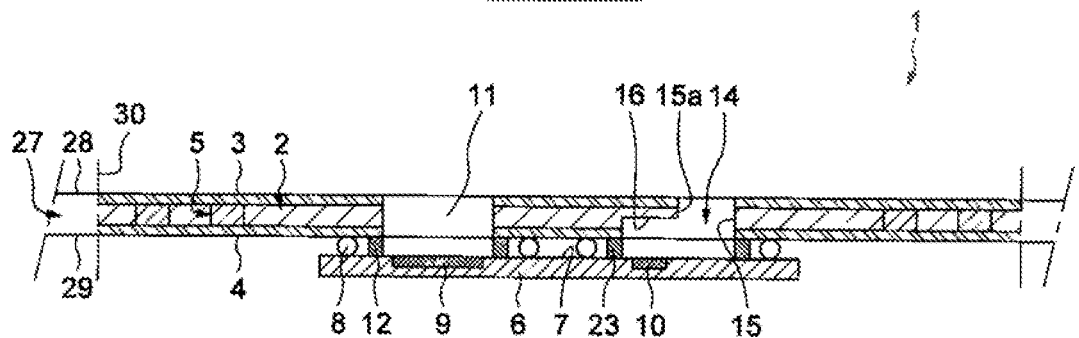

Next, as illustrated in FIG. 5, a receiving integrated circuit chip 6 is installed in each placement 30, in the position described previously, by setting in place the electrical connection elements 8 and the leaktight seals 12 and 23.

Figure 6:
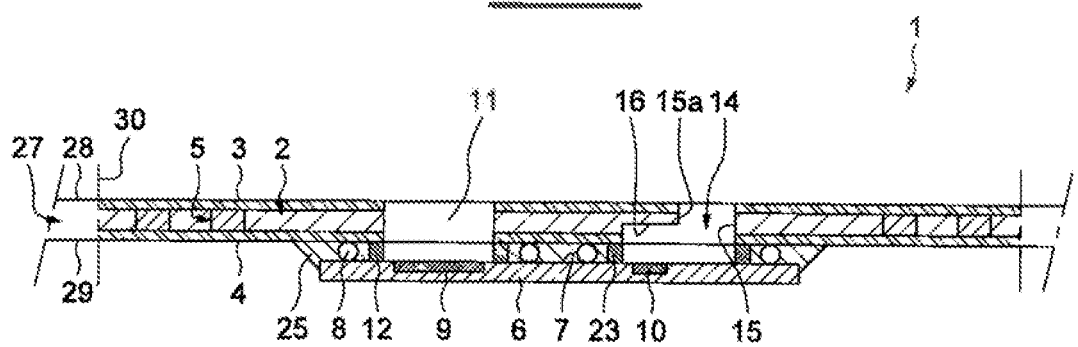

Next, as illustrated in FIG. 6, a liquid material which, after hardening, forms the encapsulation material 25 is injected into each placement 30.

Figure 7:
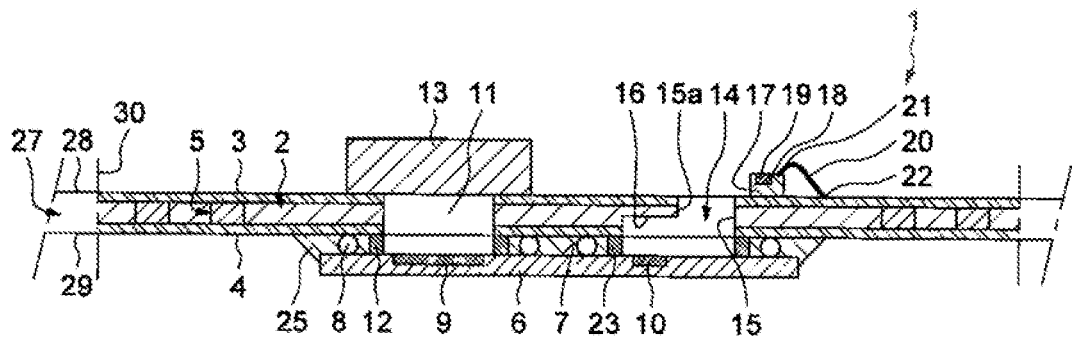

Next, as illustrated in FIG. 7, a transparent plate 13 is mounted in each placement 30, an emitting integrated circuit chip 17 is mounted and the electrical connection wires 20 are installed.

Figure 8:
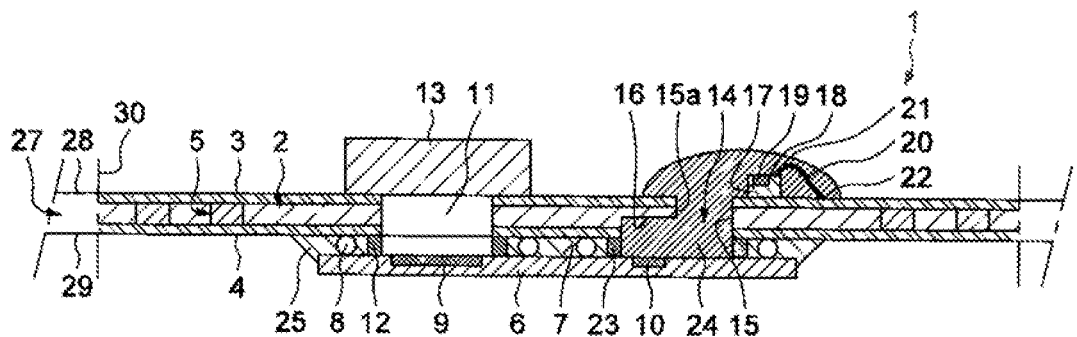

Then, as illustrated in FIG. 8, one or more drops of a liquid material, for example a transparent glue which may harden under the effect of ultraviolet radiation, which, after hardening, forms the transparent encapsulation block 24, are placed in each placement 30.

Figure 9:
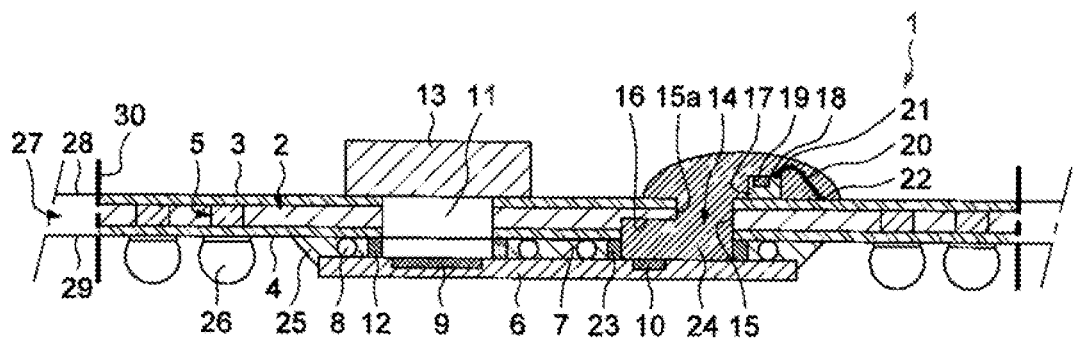
Figure 10:
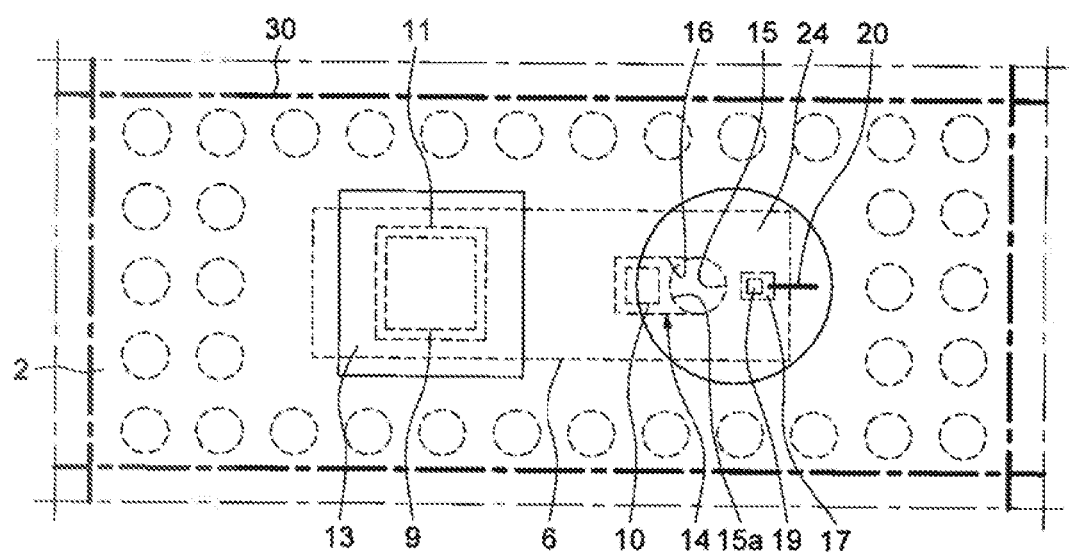

Then, as illustrated in FIGS. 9 and 10, after having installed the electrical connection elements 26, the different electronic packages 1 are singularized by cutting along the edges of the placements 30.

According to a variant embodiment of the electronic package 1 of FIG. 1, it would be possible to carry out a rear facing via the rear face 4 of the substrate wafer 2 to obtain the forwardly blind cavity 16 and a front facing offset via the front face 3 of the substrate wafer 2 to obtain the window 15a, this front facing being blind towards the rear and communicating with said rear facing, so as to form the through passage 14.

Figure 11:
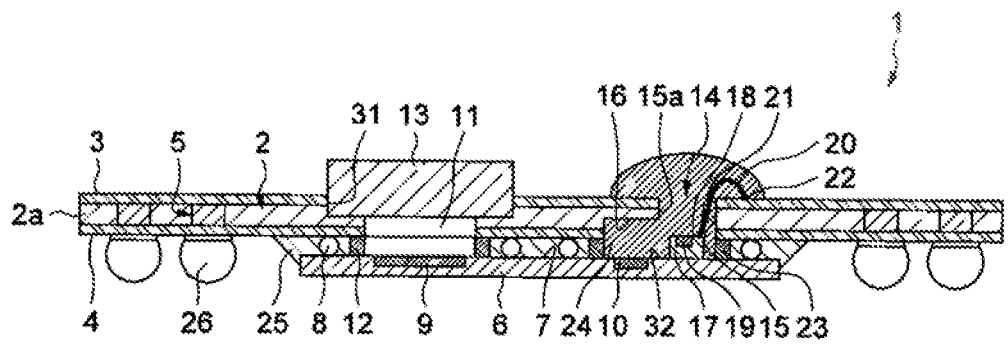
FIG. 11 represents a longitudinal cross section of an embodiment variant of the electronic package of FIG. 1.
Figure 12:
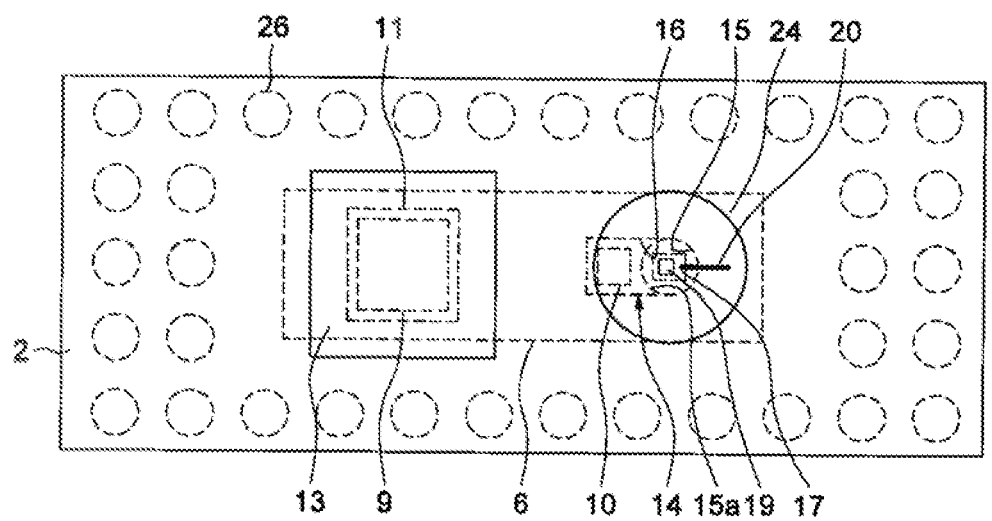
FIG. 12 represents a plan view of the electronic package of FIG. 11.

According to a variant embodiment illustrated in FIGS. 11 and 12, the substrate wafer 2 exhibits, in the main passage 11, an annular facing in which the main transparent plate 13 is introduced at least in part.

According to a variant embodiment, the main transparent plate 13 could pass through the main passage 11 and be fixed on the front face 7 of the receiving integrated circuit chip 6 by way of a transparent glue.

Furthermore, the emitting integrated circuit chip 17 is no longer on the front face 3 of the substrate wafer 2 but is placed on a zone 32 of the front face 7 of the integrated circuit chip 6 adjacent to the secondary optical sensor 10, opposite the front window 15a of the secondary through passage 14. Then, the transparent encapsulation block 24 can fill the secondary through passage 14 and overhang towards the front to a lesser extent than previously or could fill the secondary through passage 14 only up to the window 15a.

The electronic device obtained according to this variant embodiment may exhibit a reduced thickness and may be fabricated in accordance with what has been described previously.

The manner of operation of the electronic device obtained according to this variant embodiment is equivalent to that of the previous example, except that the luminous radiation emitted by the optical emitter 19 of the emitting integrated circuit chip 17 passes through the window 15a so as to be emitted to the exterior.

According to a variant embodiment, the emitting integrated circuit chip 17 could be fixed on the bottom of the aforesaid front facing.

Generally, the various fabrication steps described can be obtained by implementing the conventional means used in the microelectronics field.

According to a variant embodiment, the receiving integrated circuit chip could be subdivided into two receiving integrated circuit chips respectively comprising the optical sensors 9 and 10 and furnished respectively, optionally, with the leaktight rings 12 and 23.

The electronic packages which have just been described could be installed inside the jacket or the shell of a portable or mobile telephone having openings facing said through passages so as to face the optical emitters and the main optical sensors, so as to form proximity sensors suitable for detecting the presence or absence of an object or of a part of the human body, in order to generate a particular command in the electronic circuits of the telephone.

Figure 13:
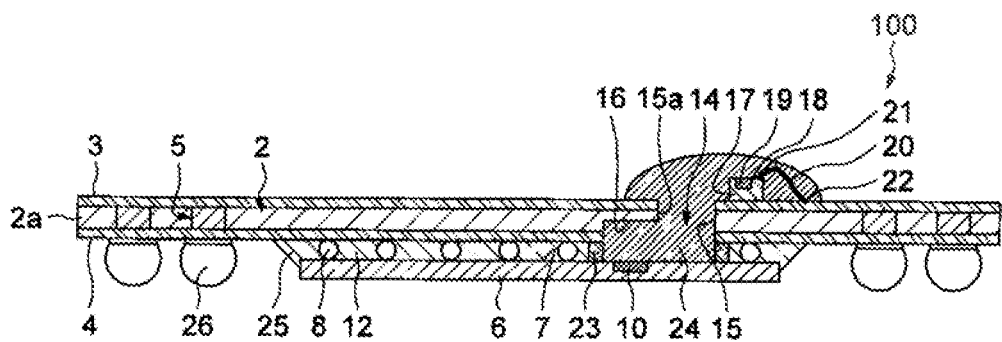
FIG. 13 represents a longitudinal cross section of another electronic package.

According to another embodiment illustrated on FIG. 13, an electronic package 100 is different from the electronic package 1 of FIG. 1 only by the fact that the receiving chip 6 comprises only the receiving sensor 10, the receiving sensor 9 and the main transparent plate 13 being absent and the through passage 11 is inexistent.

In this case, the light radiation emitted outside by the optical emitter 19 of the emitting chip 17 would be picked up by a sensor of a receiving chip of another package different from the package 100, directly or after a reflection on an object, for example for passage detection of an object or distance measurement. Any other using of the light radiation could be considered.

According to another employment, the receiving sensor 10 can be used as a controller of the good functioning of the emitter 19, for example for detecting that the radiation of the emitter 19 is present or absent or is under a normal or desired level, or simply to detect the level of the radiation.

The present invention is not limited to the examples described above. It is in particular obviously possible to combine the different arrangements of the electronic packages described differently. Many other variant embodiments are possible, without departing from the scope defined by the appended claims.

What is claimed is:

1. An electronic package, comprising:
   a substrate wafer having a front face and a rear face and having an aperture comprising:
      a first part extending longitudinally completely through the substrate wafer between the front face and the rear face to define a front window; and
      a second part extending only partially into the substrate wafer from said rear face to define a forwardly blind cavity on said rear face with a bottom surface formed by a portion of said substrate wafer intermediate between the front and rear faces, wherein the second part is in lateral communication with the first part;
   a receiving integrated circuit chip having a front face mounted on the rear face of the substrate wafer and comprising at least one optical sensor of luminous radiation, wherein the intermediate, bottom surface of the second part of the aperture faces towards the at least one optical sensor;
   a transparent encapsulant extending above said optical sensor and at least partially filling said aperture; and
   an emitting integrated circuit chip embedded in said transparent encapsulant and comprising an optical emitter of luminous radiation.

2. The package according to claim 1, wherein the emitting integrated circuit chip is mounted on the front face of the substrate wafer, in proximity to said aperture.

3. The package according to claim 1, wherein the emitting integrated circuit chip is installed in said aperture.

4. The package according to claim 3, wherein the emitting integrated circuit chip is mounted on the receiving integrated circuit chip, on a zone situated facing said forwardly blind cavity.

5. The package according to claim 1, further comprising a leaktight ring between the substrate wafer and the receiving integrated circuit chip, around said aperture.

6. The package according to claim 1, further comprising:
   an additional aperture in the substrate wafer; and
   an additional optical sensor of luminous radiation on said receiving integrated circuit chip which is situated in front of said additional aperture.

7. An electronic package, comprising:
   a substrate wafer having a front surface and a rear surface and having a first through passage extending between the front surface and the rear surface, and a second through passage extending between the front surface and the rear surface, the second through passage having an L-shape comprising a longitudinal leg extending between the front surface and the rear surface and a lateral leg extending laterally from the longitudinal leg between a cavity surface and the rear surface creating a cavity beneath the cavity surface;

a receiving integrated circuit chip mounted on the rear surface of the substrate wafer and comprising a first optical sensor of luminous radiation situated opposite said first through passage and a second optical sensor of luminous radiation situated directly facing said cavity surface and offset laterally relative to said longitudinal leg;

a transparent encapsulant extending above said second optical sensor and at least partially filling said second through passage; and an emitting integrated circuit chip embedded in said transparent encapsulant and comprising an optical emitter of luminous radiation.

8. The package according to claim 7, wherein the emitting integrated circuit chip is mounted on the front surface of the substrate wafer in proximity to said second through passage.

9. The package according to claim 7, wherein the emitting integrated circuit chip is installed in said second through passage.

10. The package according to claim 9, wherein the emitting integrated circuit chip is mounted on the receiving integrated circuit chip, on a zone situated opposite said longitudinal leg.

11. The package according to claim 7, further comprising leaktight rings between the substrate wafer and the receiving integrated circuit chip around each of said through passages.

12. The package according to claim 7, further comprising a transparent plate mounted to the front surface above said first through passage.

13. The package according to claim 7, further comprising electrical connection elements between the substrate wafer and the receiving integrated circuit chip.

14. The package according to claim 8, further comprising an encapsulation material between the substrate wafer and the receiving integrated circuit chip.

15. The package according claim 8, wherein the substrate wafer comprises an electrical connection network linked to said integrated circuit chips and is provided with external electrical connection elements.

16. A device, comprising:

a substrate wafer having a front face and a rear face and having a through passage comprising (i) a front window extending entirely through the substrate wafer between the front face and the rear face and (ii) a cavity communicating laterally with said front window and extending only partially through the substrate wafer between the rear face and a cavity face, the cavity face positioned between the front and rear faces;

a receiving integrated circuit chip having a front face mounted on the rear face of the substrate wafer and comprising at least one optical sensor of luminous radiation situated directly facing said cavity face and offset laterally relative to said front window;

a transparent encapsulant extending above said optical sensor and at least partially filling said through passage; and an emitting integrated circuit chip embedded in said transparent encapsulant and comprising an optical emitter of luminous radiation.

17. The device according to claim 16, wherein the emitting integrated circuit chip is mounted on the front face of the substrate wafer in proximity to said through passage.

18. The device according to claim 16, wherein the emitting integrated circuit chip is installed in said through passage.

* * * * *